United States Patent
Ljung et al.

(10) Patent No.: US 7,558,950 B2
(45) Date of Patent: Jul. 7, 2009

(54) METHODS OF CONFIGURING AN ELECTRONIC DEVICE TO BE OPERABLE WITH AN ELECTRONIC APPARATUS BASED ON AUTOMATIC IDENTIFICATION THEREOF AND RELATED DEVICES

(75) Inventors: Peter Ljung, Malmö (SE); Jan Nilsson, Harlösa (SE); Viktor Karl Lennart Mårtensson, Löberöd (SE)

(73) Assignee: Sony Ericsson Mobile Communications AB, Lund (SE)

( * ) Notice: Subject to any disclaimer, the term of this patent is extended or adjusted under 35 U.S.C. 154(b) by 547 days.

(21) Appl. No.: 11/260,851

(22) Filed: Oct. 27, 2005

(65) Prior Publication Data
US 2007/0096283 A1    May 3, 2007

(51) Int. Cl.
*G06F 1/24* (2006.01)
*H04L 17/02* (2006.01)
(52) U.S. Cl. ............................ 713/100; 713/1; 341/176
(58) Field of Classification Search ...................... 713/1, 713/100; 341/176
See application file for complete search history.

(56) References Cited

U.S. PATENT DOCUMENTS

| 5,333,273 A | * | 7/1994 | Raasch et al. ................. 710/67 |
| 5,410,326 A | | 4/1995 | Goldstein |
| 6,784,918 B1 | * | 8/2004 | Ritchie ........................ 348/61 |
| 6,909,378 B1 | * | 6/2005 | Lambrechts et al. ... 340/825.22 |
| 7,132,973 B2 | * | 11/2006 | Jindal ......................... 341/176 |
| 7,224,903 B2 | * | 5/2007 | Colmenarez et al. ........ 398/106 |
| 7,266,777 B2 | * | 9/2007 | Scott et al. ................... 715/762 |
| 2003/0007104 A1 | | 1/2003 | Hoshino et al. |
| 2007/0080845 A1 | * | 4/2007 | Amand ........................ 341/176 |

FOREIGN PATENT DOCUMENTS

| DE | 10110979 A1 | | 9/2002 |
| JP | 2005268941 | | 9/2005 |
| WO | WO 03/001435 A1 | | 1/2003 |
| WO | WO2005/043484 | * | 5/2005 |
| WO | WO 2005/043484 A1 | | 5/2005 |

* cited by examiner

*Primary Examiner*—Chun Cao
(74) *Attorney, Agent, or Firm*—Myers Bigel Sibley & Sajovec, P.A.

(57) ABSTRACT

A method of configuring an electronic device to be operable with an electronic apparatus. The method comprises obtaining at least one image associated with the electronic apparatus, submitting a request for identifying the electronic apparatus to at least one data repository, said request including the at least one image, receiving from the at least one data repository configuration data associated with the electronic apparatus and configuring the electronic device using the configuration data. An electronic device that may be configured according to the disclosed method is also disclosed.

14 Claims, 4 Drawing Sheets

METHODS OF CONFIGURING AN ELECTRONIC DEVICE TO BE OPERABLE WITH AN ELECTRONIC APPARATUS BASED ON AUTOMATIC IDENTIFICATION THEREOF AND RELATED DEVICES

FIELD OF THE INVENTION

The present invention relates to methods for configuring electronic devices. The present invention also relates to configurable electronic devices.

BACKGROUND OF THE INVENTION

The use of electronic apparatuses for media applications, such as TVs, video cassette recorders (VCRs), digital versatile disc (DVD) players, stereos etc. has e.g. lead to that people in their homes have an increasing number of remote controls for controlling the electronic apparatuses. Typically an infrared (IR) interface is used for communicating data between the remote control and the electronic apparatus. A radio frequency (RF) interface may also be used for controlling an electronic apparatus from a remote control.

To reduce the number of remote controls, so called universal remote controls have been developed. These are capable of controlling a plurality of electronic apparatuses. A disadvantage of existing universal remote controls is that they are difficult to configure for use with specific electronic apparatuses.

As an example, a universal remote control may be configured for use with an electronic apparatus by entering a code, e.g. a multi-digit code, identifying the electronic apparatus on a key pad on the universal remote control. This requires that the user has knowledge of the code that identifies the electronic apparatus to be controlled. This may in turn require that the user has a precise knowledge of the brand and/or model name of the electronic apparatus to be controlled in order to find the correct code in e.g. an electronically stored database or in a typed list of electronic apparatuses supported by the universal remote control. The process of manually finding the correct code may be time consuming and prone to errors, which may be a source of annoyance and frustration for the user.

Alternatively, the universal remote control may be configured by browsing through lists of brand and model names displayed on a display on the universal remote control and retrieving configuration data from a database located in the universal remote control. This way of configuring the universal remote control may also be time consuming and prone to errors, since the user needs to manually identify the electronic apparatus in the lists of brand and model names.

As another example, a universal remote control may be configured key by key in a learning mode of the universal remote control. This may be done, e.g. by directing an IR transmitter of a remote control configured to control the electronic apparatus towards a learning eye of the universal remote control and transmitting IR data corresponding to the key to be configured to the universal remote control. This process is repeated for each key that is to be configured. This way of configuring the universal remote control may also be time consuming and prone to errors.

The known techniques may be inefficient as they may be time consuming and/or may have relatively high error probabilities associated with them.

SUMMARY OF THE INVENTION

It may be an object of some embodiments of the invention to provide an efficient method for configuring an electronic device. Another object of some embodiments of the invention may be to provide an electronic device, which may be efficiently configurable.

According to some embodiments, a method of configuring an electronic device to be operable with an electronic apparatus may include obtaining at least one image associated with the electronic apparatus, submitting a request for identifying the electronic apparatus to at least one data repository, said request including the at least one image, receiving from the at least one data repository configuration data associated with the electronic apparatus, and configuring the electronic device using the configuration data.

The step of submitting the request to at least one data repository may include submitting the request to at least one data repository located in the electronic device.

The step of submitting the request to at least one data repository may include submitting the request to at least one data repository located in at least one external server.

The step of submitting the request to at least one data repository may include submitting the request to at least one data repository located in the electronic device and conditionally submitting the request to at least one data repository located in at least one external server if the identification of the electronic apparatus in the at least one data repository located in the electronic device is unsuccessful.

The step of obtaining at least one image associated with the electronic apparatus may include generating at least one image of an object associated with the electronic apparatus using an image-generation unit in the electronic device.

The step of generating at least one image may include generating at least one image of at least one of the electronic apparatus and a remote control adapted to control the electronic apparatus.

The step of obtaining at least one image associated with the electronic apparatus may include selecting the at least one image from a plurality of images stored in the electronic device.

According to other embodiments, a computer program product may include computer program code means for executing the method for configuring an electronic device to be operable with an electronic apparatus, when said computer program code means are run by an electronic device having computer capabilities.

According to a still other embodiments, a computer readable medium has stored thereon a computer program product comprising computer program code means for executing the method for configuring an electronic device to be operable with an electronic apparatus, when said computer program code means are run by an electronic device having computer capabilities.

According to some embodiments, a configurable electronic device may include an image unit adapted to obtain at least one image associated with an electronic apparatus, a search-request unit adapted to submit a search request including the at least one image to a data repository to identify the electronic apparatus, a receive unit adapted to receive configuration data associated with the identified electronic apparatus from the at least one data repository, and a configuration unit adapted to configure the configurable electronic device using the received configuration data.

The electronic device may include a data repository adapted to store a plurality of images of electronic apparatuses and configuration data associated with the electronic apparatuses.

The electronic device may include an image generation unit adapted to generate the at least one image.

The electronic device may be a portable or handheld mobile radio communication equipment, a mobile radio terminal, a pager, a communicator, an electronic organizer, a smartphone or a computer. The electronic device may be a mobile telephone.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

FIG. 1b is a backside view of the electronic device in FIG. 1a;

DETAILED DESCRIPTION OF EMBODIMENTS OF THE INVENTION

Figure 1A:
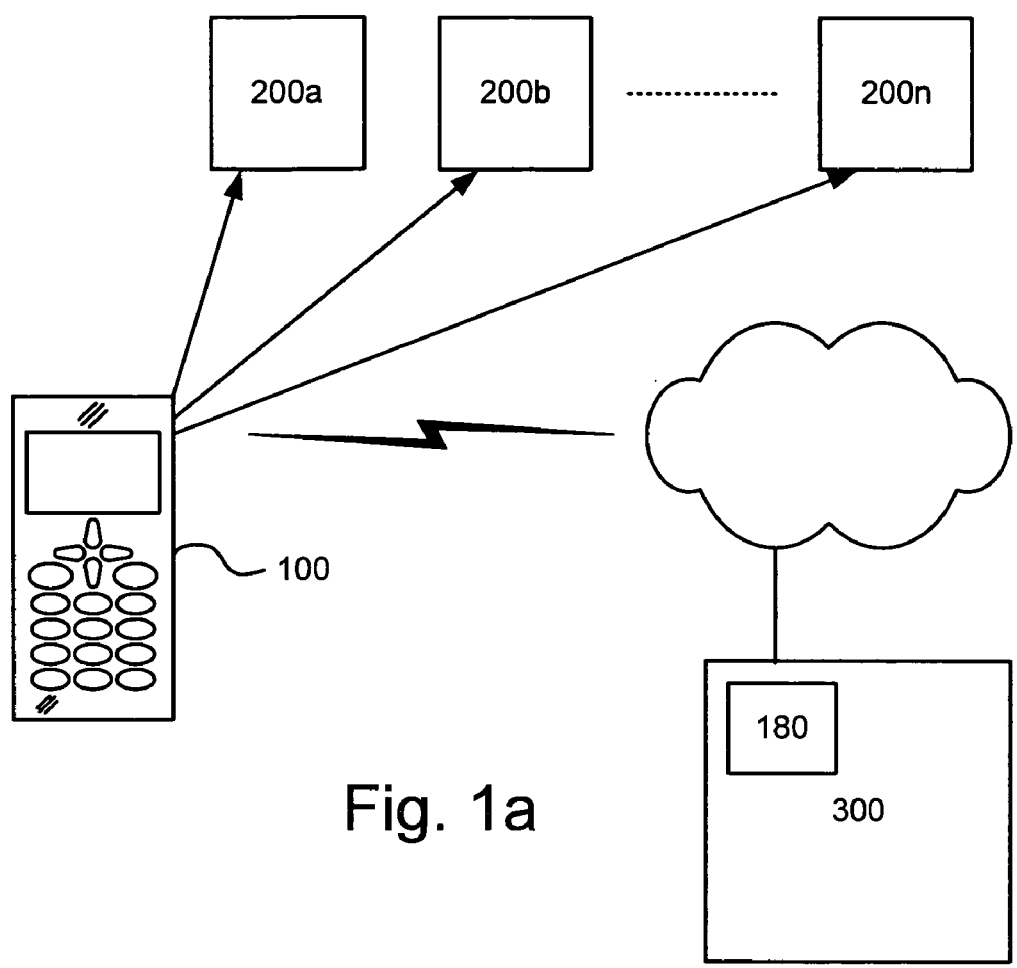
FIG. 1a is a schematic view of an electronic device and electronic apparatuses.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention, and is further described in detail below. In the drawings, like numbers refer to like elements.

Figure 1B:
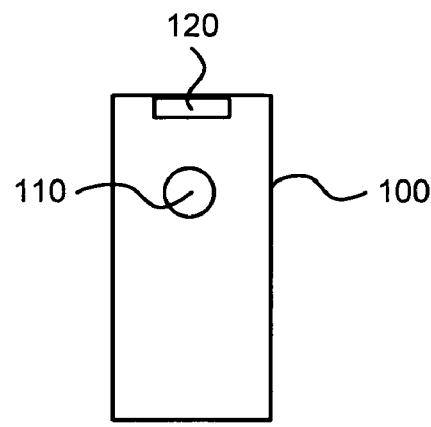

A situation where embodiments of the present invention may be used is illustrated in FIG. 1a. An electronic device 100 is operable as a remote control for one or several electronic apparatuses 200a-n. The electronic apparatus 200a-n may be a DVD player, a VCR, or a TV. The electronic device 100 may comprise an image-generation unit or camera 110 and an IR communication unit 120, as illustrated in FIG. 1b showing an alternative view of the electronic device 100. FIG. 1b shows a backside of the electronic device 100 which is opposite to the front side of the electronic device 100 shown in FIG. 1a. The position of the image-generation unit 110 and the IR communication unit 120 shown in FIG. 1b are only examples. The image-generation unit 110 and the IR communication unit 120 may be positioned anywhere on the electronic device 100.

The electronic device 100 is configurable by submitting a request including at least one image associated with the electronic apparatus 200a-n to at least one data repository 180 wherein the electronic apparatus 200a-n is identified based on the at least one image. The data repository 180 may be a database. If the electronic apparatus 200a-n is identified, appropriate configuration data is received from the at least one data repository 180 and utilized in the electronic device 100 to configure the electronic device 100. The configuration may be carried out without user intervention. Hence, the configuration of the electronic device 100 may be more efficient than configuration according to known techniques.

Figure 2:
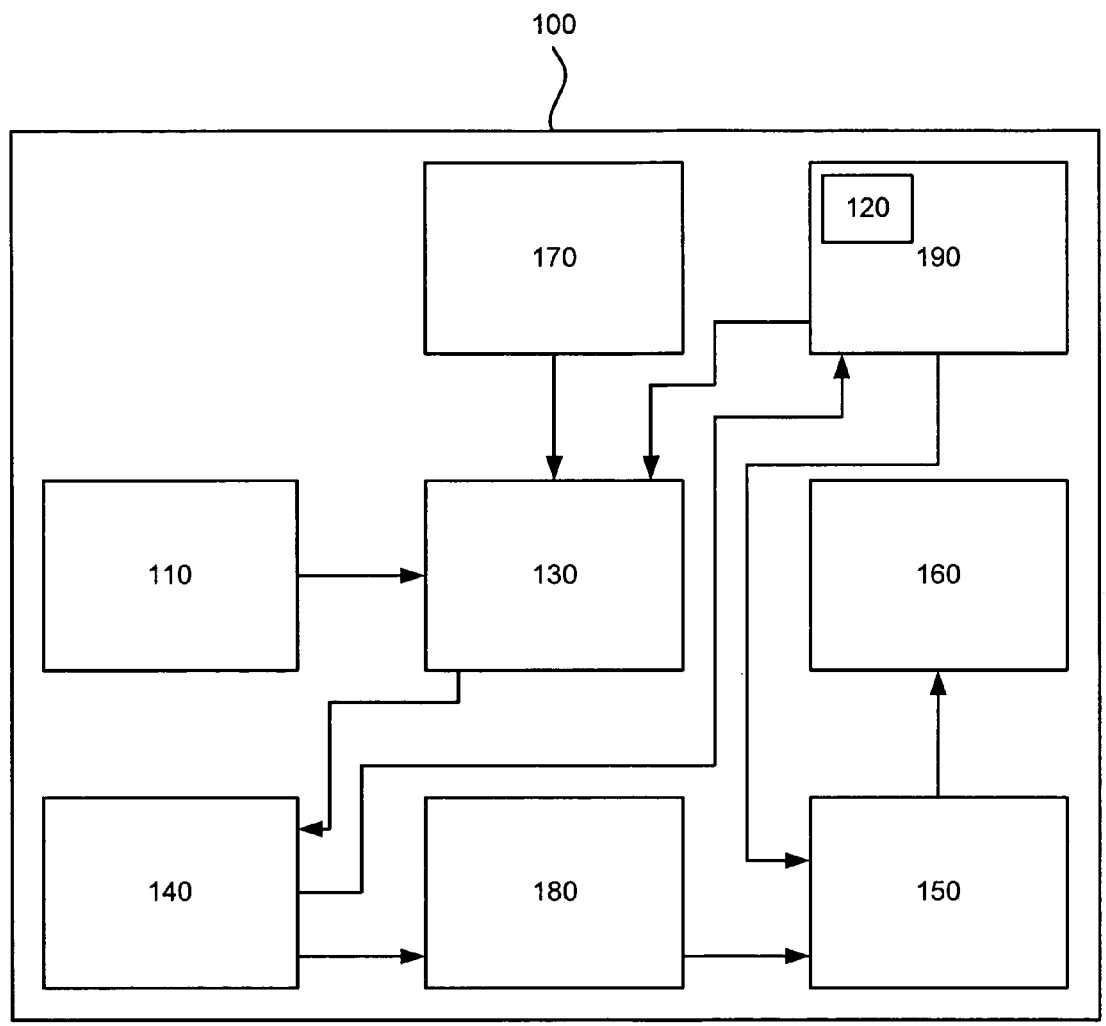
FIG. 2 is a block diagram of an electronic device.

FIG. 2 shows a block diagram of an embodiment of the electronic device 100 in FIG. 1. The electronic device 100 comprises an image unit 130. The image unit 130 is adapted to obtain the at least one image associated with the electronic apparatus. The electronic device 100 further includes a search-request unit 140 operatively connected to the image unit 130. The search-request unit 140 is adapted to submit a request to the at least one data repository 180 for identifying the electronic apparatus 200a-n. The request may be a search request. The request may include the at least one image obtained in the image unit. The at least one image may be transferred to the search-request unit 140 from the image unit 130. The at least one data repository 180 may store a plurality of images and configuration data associated with electronic apparatuses 200a-n. Image recognition techniques may be utilized for comparing the at least one image included in the request submitted to the data repository 180 with the plurality of images stored in the data repository 180 in order to identify the electronic apparatus 200a-n. The electronic device 100 further comprises a receive unit 150 adapted to receive configuration data associated with the electronic apparatus 200a-n from the at least one data repository 180. The receive unit is operatively connected to a configuration unit 160, which is adapted to configure the electronic device 100 using the configuration data received by the receive unit 150.

The electronic device 100 may further include an image-generation unit 110, such as a still camera or a video camera, operatively connected to the image unit 130. The image-generation unit 110 may be utilized for obtaining the at least one image. The at least one image may alternatively be obtained from a memory unit 170 which may be included in the electronic device and operatively connected to the image unit 130. The electronic device 100 may include a data repository 180 operatively connected to the search-request unit 140 and the receive unit 150. The data repository 180 may be located in a database unit. The electronic device 100 may further include a communication interface unit 190 including at least one communication interface. The communication interface unit 190 may be adapted to provide communication with at least one external server 300. The at least one external server 300 may store at least one of the at least one data repository 180. Further, the communication interface unit 190 may be adapted to provide operative connection between the image unit 130 and at least one image-generation unit 110, which may be located externally from the electronic device 100.

Figure 3:
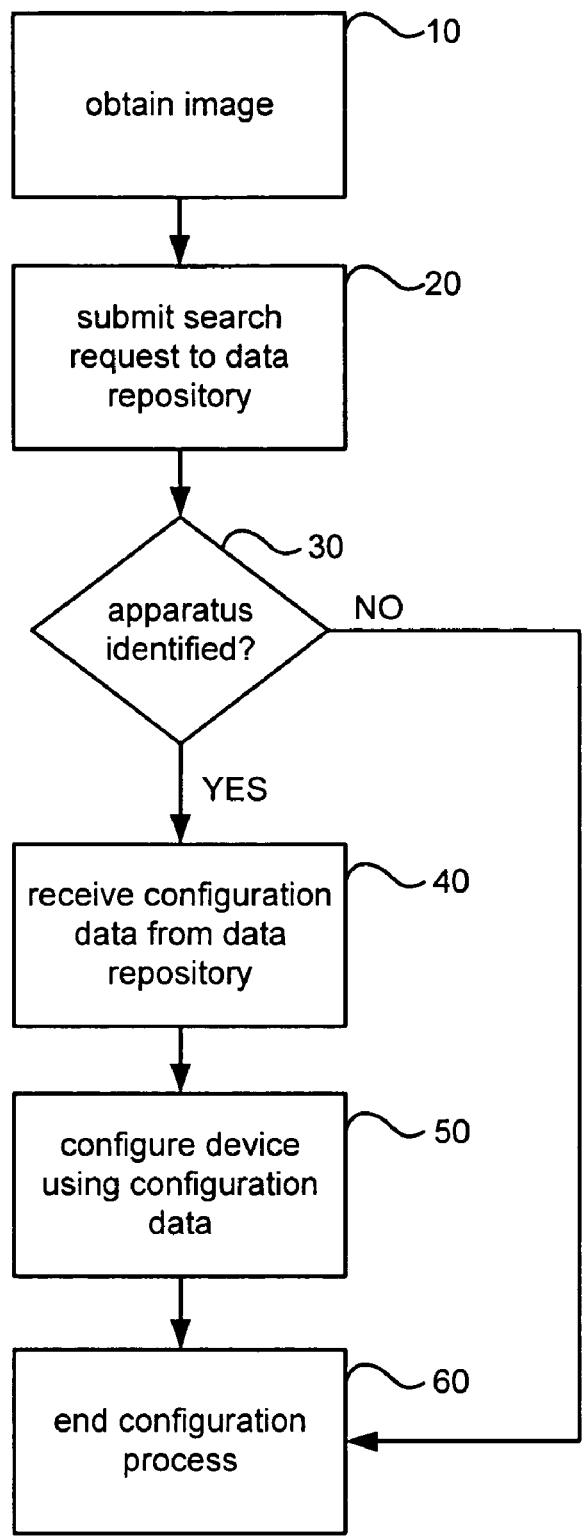
FIG. 3 is a flow chart of an embodiment of a method for configuring an electronic device.

FIG. 3 illustrates an embodiment of a method for configuring the electronic device 100. The method may be used for configuring the electronic device 100 to be operable with the electronic apparatus 200a-n. The operability may include that the electronic device 100 may act as a remote control for the electronic apparatus 200a-n. In a first step 10, at least one image associated with the electronic apparatus 200a-n is obtained. The at least one image may be a still image of an object, which is at least associated with the electronic apparatus 200a-n. The object may e.g. be the electronic apparatus 200a-n itself or a remote control adapted to remotely control the electronic apparatus 200a-n. The at least one image may also be a series of images, such as a video sequence, of the object associated with the electronic apparatus 200a-n. The at least one image may be obtained by that the user directs the image-generation unit 110 towards the object associated with the electronic apparatus 200a-n and presses a key provided on the electronic device 100, the key being adapted to initiate the configuration of the electronic device 100 when pressed. The configuration process may proceed without further user intervention. In another embodiment, the at least one image is obtained from an image-generation unit 110, which is located externally from the electronic device 100 and operatively connected to the electronic device 100 through a communication interface in the communication interface unit 190. The communication interface may be a wireless interface such as an IR interface or an RF interface. The communication interface may also be a wired interface such as a universal serial bus (USB) interface or an RS232 interface. In another embodiment, the image is obtained through user selection from a plurality of images stored in the memory unit 170.

In a second step 20 a request is submitted to at least one data repository 180. The request may include the at least one image obtained in step 10. The request is a request for configuration data for the electronic apparatus 200a-n. The at least one data repository 180 may be adapted to store configuration data associated with the electronic apparatus 200a-n. Known image-recognition techniques may be utilized to identify the electronic apparatus 200a-n in the at least one data repository 180.

In an embodiment, the method is used for configuring the electronic device 100 to act as a remote control for the electronic apparatus 200a-n. In this embodiment, the configuration data may include key codes for a remote control adapted to remotely control the electronic apparatus 200a-n. The configuration data may alternatively include configuration data for a graphical user interface (GUI).

In step 30, it is checked whether the electronic apparatus 200a-n was identified in the at least one data repository 180. This may be done e.g. by receiving a search-result message from the at least one data repository 180, said search-result message indicating if the electronic apparatus 200a-n was identified. If the electronic apparatus 200a-n was not identified, the configuration process is ended 60, and the user may be signaled by the electronic device 100 that the configuration process has failed and the user may be presented with the option of configuring the electronic device 100 manually, e.g. using a known method. If the electronic apparatus 200a-n has been identified in the data repository 180, the method proceeds to step 40. In step 40, the configuration data associated with the identified electronic apparatus 200a-n is received from the data repository 180.

In step 50, the received configuration data is used to configure the electronic device 100. The configuration may alternatively include presenting the user with a GUI for a remote control adapted to control the electronic apparatus 200a-n. In step 60, the configuration process is ended.

In an embodiment, the request is submitted to at least one data repository 180 located internally in the electronic device 100.

In an alternative embodiment, the electronic device 100 may be connected to at least one external server 300, e.g. over a local-area network (LAN) or a wide-area network (WAN), such as the Internet, as indicated in FIG. 1. For example, the electronic device 100 may be a mobile telephone connected to a personal computer (PC) via an IR, Bluetooth, and/or USB interface or to the Internet via general packet radio service (GPRS) or universal mobile telecommunications system (UMTS). The step 20 of submitting the request to at least one data repository 180 may then include submitting the request to at least one data repository 180 located in the at least one external server 300.

Figure 4:
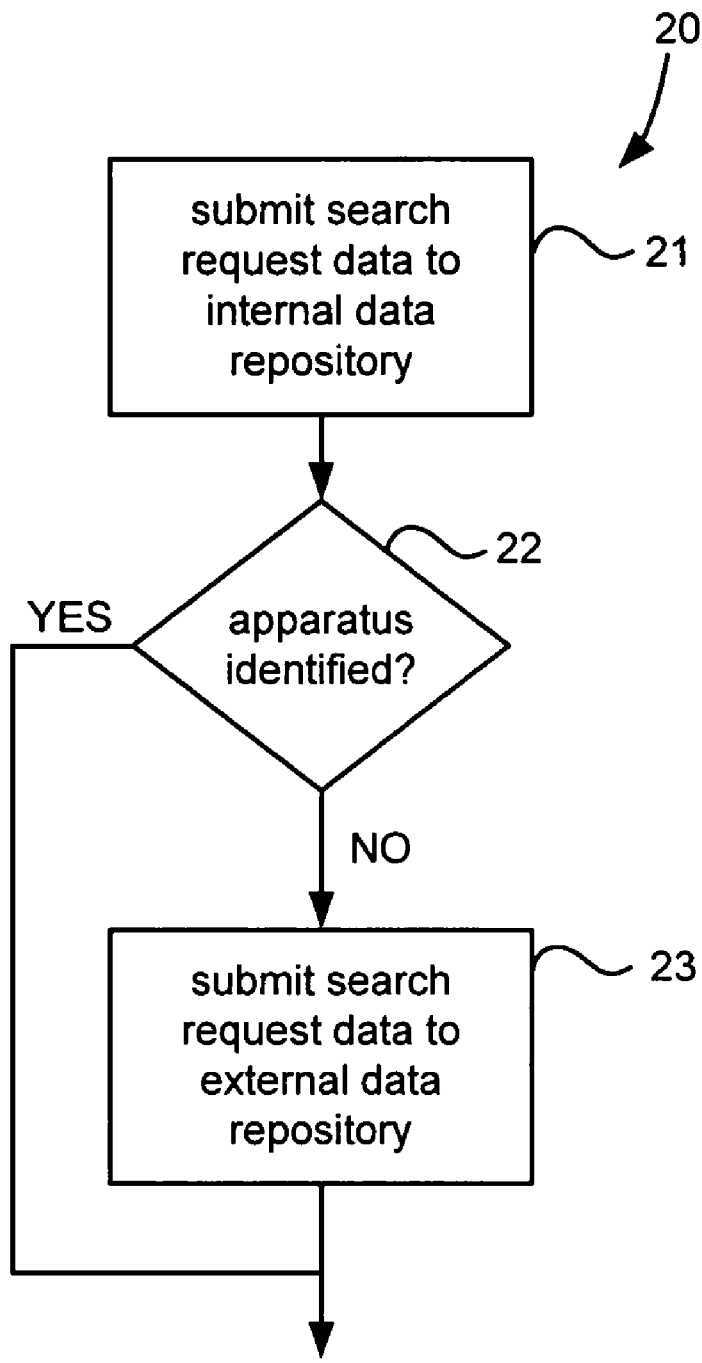
FIG. 4 is a flow chart of an embodiment of a process step of the method illustrated in FIG. 3.

In an embodiment, step 20 of FIG. 3 is carried out according the flow chart shown in FIG. 4. The request is first submitted to an internal data repository, e.g. a data repository 180 located in the database unit internally in the electronic device 100, in step 21. In step 22, it is checked whether identification of the electronic apparatus 200a-n in the internal data repository was successful. If the electronic apparatus 200a-n was identified in the internal data repository, the process may proceed to step 30 in FIG. 3 as described above. If the electronic apparatus 200a-n was not identified in the internal data repository, the process may proceed with step 23, wherein the request is submitted to the external data repository. Thereafter, the process may proceed with step 30 in FIG. 3 as described above.

In an alternative embodiment, the request may be submitted to a plurality of external data repositories in sequence until the electronic apparatus 200a-n is identified or the search request to the last data repository in the plurality of data repositories has been submitted.

In another embodiment, the request may be submitted to a plurality of data repositories 180 in parallel. If the electronic apparatus 200a-n is identified in more than one data repository 180, the user may be presented with the option of choosing which data repository 180 to receive configuration data from.

In an alternative embodiment, the image associated with the electronic apparatus 200a-n, which image is stored in the at least one data repository 180, is included in the configuration data received by the receive unit 150. This image may be of a higher quality, e.g. having a larger number of pixels, than the image obtained by the image unit 130. This image may be presented to the user on a display of the electronic device 100 to allow the user to manually verify that the correct configuration data has been downloaded from the at least one data repository 180.

Embodiments of the invention have been described in the context of configuring an electronic device 100 to act as a remote control for an electronic apparatus 200a-n. In an alternative embodiment, the electronic apparatus 200a-n may be a computer device, such as a PC or a personal digital assistant (PDA). The configuration may include setting up communication parameters between the electronic device 100 and the computer device, e.g. for synchronization of data between the electronic device 100 and the computer device, such as calendar data and address-book data.

In another alternative embodiment, the configuration of the electronic device 100 includes pairing with the electronic apparatus 200a-n in accordance with a communication protocol, such as the Bluetooth protocol. The electronic apparatus 200a-n may e.g. be embodied as a Bluetooth headset comprising a microphone and/or a loudspeaker. The electronic device 100 may be located within communication range with at least one electronic apparatus 200a-n via Bluetooth radio. Each of the at least one electronic apparatus 200a-n may include a data repository 180 storing at least one image associated with the electronic apparatus 200a-n and configuration data sufficient for Bluetooth pairing. To initiate the configuration of the electronic device, at least one image associated with an electronic apparatus 200a-n with which Bluetooth pairing is to be initiated is obtained by the image unit 130 as described earlier. A request including the at least one image obtained by the image unit 130 is submitted to each of the data repositories located in the electronic apparatuses 200a-n that are within communication range from the electronic device 100. The at least one image may be utilized by the data repository 180 located in a specific electronic apparatus to identify whether the at least one image is associated with the specific electronic apparatus. If so, the data repository 180 located in the specific electronic apparatus may respond to the electronic device 100 by sending an acknowledge message. The acknowledge message may include the configuration data. Alternatively, the configuration data may be downloaded from the data repository 180 located in the specific electronic apparatus by the electronic device 100 after the acknowledge message has been received. The acknowledge message may alternatively include an identifier for the specific electronic apparatus, e.g. brand and/or model name. If acknowledge messages are received from more than one electronic apparatus 200a-n, data included in the identifiers of the acknowledge messages may be presented on a display of the electronic device 100. The user may further be presented with a choice regarding with which of the electronic apparatuses 200a-n that has sent an acknowledge message the pairing should be initiated. The choice may be based on the received identifiers. The electronic device 100 may be a terminal. The terminal may be a mobile terminal, such as a mobile radio terminal, e.g. a mobile telephone or a communicator, i.e. electronic organizer, smartphone or the like.

The electronic apparatus 200a-n, may be, but is not limited to, one of a TV, DVD, VCR, stereo, PC, or PDA.

Some embodiments of the invention may be embedded in a computer program product, which enables implementation of the method and functions described herein. Embodiments of the invention may be carried out when the computer program product is loaded an run in a system having computer capabilities. Computer program, software program, program product, or software, in the present context mean any expression, in any programming language, code or notation, of a set of instructions intended to cause a system having a processing capability to perform a particular function directly or after conversion to another language, code or notation.

As will be appreciated by one of skill in the art, the present invention may be embodied as devices, methods, and computer program products. Accordingly, the present invention may be embodied in hardware and/or in software (including firmware, resident software, micro-code, etc.). Computer program code for carrying out operations of the present invention may be written in an object oriented programming language such as Java®, Smalltalk or C++, a conventional procedural programming languages, such as the "C" programming language, or lower-level code, such as assembly language and/or microcode. The program code may execute entirely on a single processor and/or across multiple processors, as a stand-alone software package or as part of another software package.

The present invention is described below with reference to flowchart illustrations and/or block and/or flow diagrams of methods according to embodiments of the invention. It should be noted that the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block and/or flow diagram block or blocks.

These computer program instructions may also be stored in a computer-readable memory that can direct a computer or other programmable processor to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processor to cause a series of operational steps to be performed on the computer or other programmable processor to produce a computer implemented process such that the instructions which execute on the computer or other programmable processor provide steps for implementing the functions or acts specified in the flowchart and/or block diagram block or blocks.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and/or the relevant art, and will not be interpreted in an idealized or overly formal sense unless expressly so defined herein.

The present invention has been described above with reference to specific embodiments. However, other embodiments than the above described are possible within the scope of the invention. Different method steps than those described above, performing the method by hardware or software, may be provided within the scope of the invention. The different features and steps of the invention may be combined in other combinations than those described. The scope of the invention is only limited by the appended patent claims.

That which is claimed:

1. A method of configuring an electronic device to be operable with an electronic apparatus comprising:
   obtaining at least one image associated with the electronic apparatus;
   submitting a request for identifying the electronic apparatus to at least one internal data repository located in the electronic device, said request including the at least one image;
   comparing the at least one image included in the request with a plurality of images stored in the internal data repository using image recognition techniques to identify the electronic apparatus;
   conditionally submitting the request including the at least one image to at least one external data repository located outside of the electronic device in response to unsuccessful identification of the electronic apparatus based on the plurality of images in the internal data repository;

receiving from at least one of the internal data repository and the external data repository configuration data associated with the electronic apparatus in response to the request; and configuring the electronic device using the configuration data.

2. The method according to claim 1, wherein the step of obtaining at least one image associated with the electronic apparatus includes generating at least one image of an object associated with the electronic apparatus using an image-generation unit in the electronic device.

3. The method according to claim 2, wherein the step of generating at least one image includes:

generating at least one image of at least one of the electronic apparatus and a remote control configured to control the electronic apparatus.

4. The method according to claim 1, wherein the step of obtaining at least one image associated with the electronic apparatus includes:

selecting the at least one image from a plurality of images stored in the electronic device.

5. The method according to claim 1, wherein the at least one external data repository comprises one of a plurality of external data repositories located outside of the electronic device, and wherein conditionally submitting the request comprises conditionally submitting the request to the plurality of external data repositories in parallel.

6. The method according to claim 1, wherein conditionally submitting the request comprises wirelessly transmitting the request to the external data repository.

7. A configurable electronic device comprising:

an image unit configured to obtain at least one image associated with an electronic apparatus;

at least one internal data repository configured to store a plurality of images of electronic apparatuses and configuration data associated with the electronic apparatuses;

a search-request unit configured to submit a search request including the at least one image to the internal data repository and compare the at least one image with a plurality of images stored in the internal data repository using image recognition techniques to identify the electronic apparatus, wherein the search-request unit is further configured to conditionally submit the search request including the at least one image to at least one external data repository located outside of the electronic device in response to unsuccessful identification of the electronic apparatus based on the plurality of images in the internal data repository;

a receive unit configured to receive configuration data associated with the identified electronic apparatus from at least one of the internal data repository and the external data repository in response to the search request; and a configuration unit configured to configure the configurable electronic device using the received configuration data.

8. The electronic device according to claim 7, further including:

an image generation unit configured to generate the at least one image.

9. The electronic device according to claim 7, wherein the electronic device is a portable or handheld mobile radio communication equipment, a mobile radio terminal, a pager, a communicator, an electronic organizer, a smartphone or a computer.

10. The electronic device according to claim 7, wherein the electronic device is a mobile telephone.

11. The electronic device according to claim 8, wherein the at least one image comprises one of an image of the electronic apparatus and an image of a remote control configured to control the electronic apparatus.

12. The electronic device according to claim 7, wherein the image unit is configured to select the at least one image from a plurality of images stored in the electronic device.

13. The electronic device according to claim 7, wherein the at least one external data repository comprises one of a plurality of external data repositories located outside of the electronic device, and wherein the search-request unit is configured to conditionally submit the request to the plurality of external data repositories in parallel.

14. The electronic device according to claim 7, further comprising:

a communication interface unit configured to wirelessly transmit the request to the external data repository and wirelessly receive the configuration data from the external data repository.

* * * * *